US011212498B2

(12) United States Patent
Lukac

(10) Patent No.: US 11,212,498 B2
(45) Date of Patent: Dec. 28, 2021

(54) INFRARED CROSSTALK CORRECTION FOR HYBRID RGB-IR SENSORS

(71) Applicant: INTEL CORPORATION, Santa Clara, CA (US)

(72) Inventor: Rastislav Lukac, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 232 days.

(21) Appl. No.: 16/216,167

(22) Filed: Dec. 11, 2018

(65) Prior Publication Data

US 2019/0110037 A1    Apr. 11, 2019

(51) Int. Cl.
*H04N 9/64* (2006.01)
*H04N 9/73* (2006.01)
(Continued)

(52) U.S. Cl.
CPC ....... *H04N 9/646* (2013.01); *H01L 27/14621* (2013.01); *H01L 27/14645* (2013.01);
(Continued)

(58) Field of Classification Search
None
See application file for complete search history.

(56) References Cited

U.S. PATENT DOCUMENTS 7,652,251 B1 *   1/2010   King ..................... G03B 15/00
                                                          250/332
8,243,210 B2 *   8/2012   Bing .................... H04N 9/3182
                                                          348/744
(Continued)

FOREIGN PATENT DOCUMENTS

CN    105872510 A  *  4/2016
CN    103686111     * 11/2016
JP    2014-154977 A *  8/2016

OTHER PUBLICATIONS

He et al, Convolutional Sparse Coding for RGB+NIR Imaging, IEEE Transactions on Image Processing, vol. 27, No. 4, Apr. 2018 1611. (Year: 2018).*

(Continued)

*Primary Examiner* — Andrae S Allison
(74) *Attorney, Agent, or Firm* — Hanley, Flight & Zimmerman, LLC

(57) ABSTRACT

Techniques are provided for infrared (IR) crosstalk correction for hybrid Red-Green-Blue-IR (RGB-IR) sensors. A methodology implementing the techniques according to an embodiment includes estimating illumination characteristics applied to a subject. The estimation is based on the subject image provided by a hybrid RGB-IR sensor, which comprises a plurality of pixels, each of the pixels associated with an R, G, B, or IR channel. The method further includes selecting a set of correction model parameters from a calibration database, the selection based on the estimated illumination characteristics, and generating a correction model based on the selected set of correction model parameters. The correction model provides correction weights for the RGB channels. The method further includes generating RGB correction values as a product of the correction weights and the IR channel and adjusting the RGB channels by the correction values to reduce IR crosstalk between the IR channel and the RGB channels.

28 Claims, 9 Drawing Sheets
(2 of 9 Drawing Sheet(s) Filed in Color)

(51) Int. Cl.
  *H01L 27/146* (2006.01)
  *H04N 5/33* (2006.01)
  *H04N 9/04* (2006.01)

(52) U.S. Cl.
  CPC ......... *H01L 27/14649* (2013.01); *H04N 5/33* (2013.01); *H04N 9/04553* (2018.08); *H04N 9/73* (2013.01)

(56) References Cited

U.S. PATENT DOCUMENTS

| | | | | |
|---|---|---|---|---|
| 9,743,057 B2* | 8/2017 | Cote | ................. | H04N 5/23254 |
| 10,341,586 B2* | 7/2019 | Huang | ................. | H04N 5/2254 |
| 2005/0231617 A1* | 10/2005 | Kitani | ................. | H04N 9/646 |
| | | | | 348/246 |
| 2012/0200734 A1* | 8/2012 | Tang | ................. | H04N 9/04559 |
| | | | | 348/223.1 |
| 2014/0168378 A1* | 6/2014 | Hall | ................. | G06F 3/0425 |
| | | | | 348/47 |
| 2015/0256800 A1* | 9/2015 | Sugiyama | ............. | H04N 5/374 |
| | | | | 348/279 |
| 2016/0156855 A1* | 6/2016 | Boulanger | ............... | H04N 5/33 |
| | | | | 348/164 |
| 2016/0198103 A1* | 7/2016 | Tanaka | ................. | G03B 15/05 |
| | | | | 348/164 |
| 2016/0255290 A1* | 9/2016 | Wajs | ................. | H04N 9/77 |
| | | | | 348/164 |
| 2016/0373676 A1* | 12/2016 | Zhang | ................. | H04N 5/33 |
| 2017/0237887 A1* | 8/2017 | Tanaka | ................. | G03B 15/05 |
| | | | | 348/164 |
| 2017/0374299 A1* | 12/2017 | Liu | ................. | G06T 5/50 |

OTHER PUBLICATIONS

Tang, Huixuan, et al. "High resolution photography with an RGB-infrared camera." 2015 IEEE International Conference on Computational Photography (ICCP). IEEE, 2015. (Year: 2015).*

* cited by examiner

Image Pre-Correction
700

Image Post-Correction
710

INFRARED CROSSTALK CORRECTION FOR HYBRID RGB-IR SENSORS

BACKGROUND

Hybrid Red-Green-Blue-Infrared (RGB-IR) sensors are often used for imaging applications that require the capture of visual information in both visible and infrared spectra. These sensors have become popular in devices such as laptops, mobile phones, and security cameras due to their capabilities to enhance traditional color imaging, provide improved daytime/nighttime vision, and support various machine vision applications, such as gesture sensing, face detection and recognition, iris detection, and eye tracking. Unfortunately, IR crosstalk between the IR channel and the RGB color channels often causes color degradation, such as desaturation and color shifts, due to the interference of the IR component in each RGB color channel.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 1:
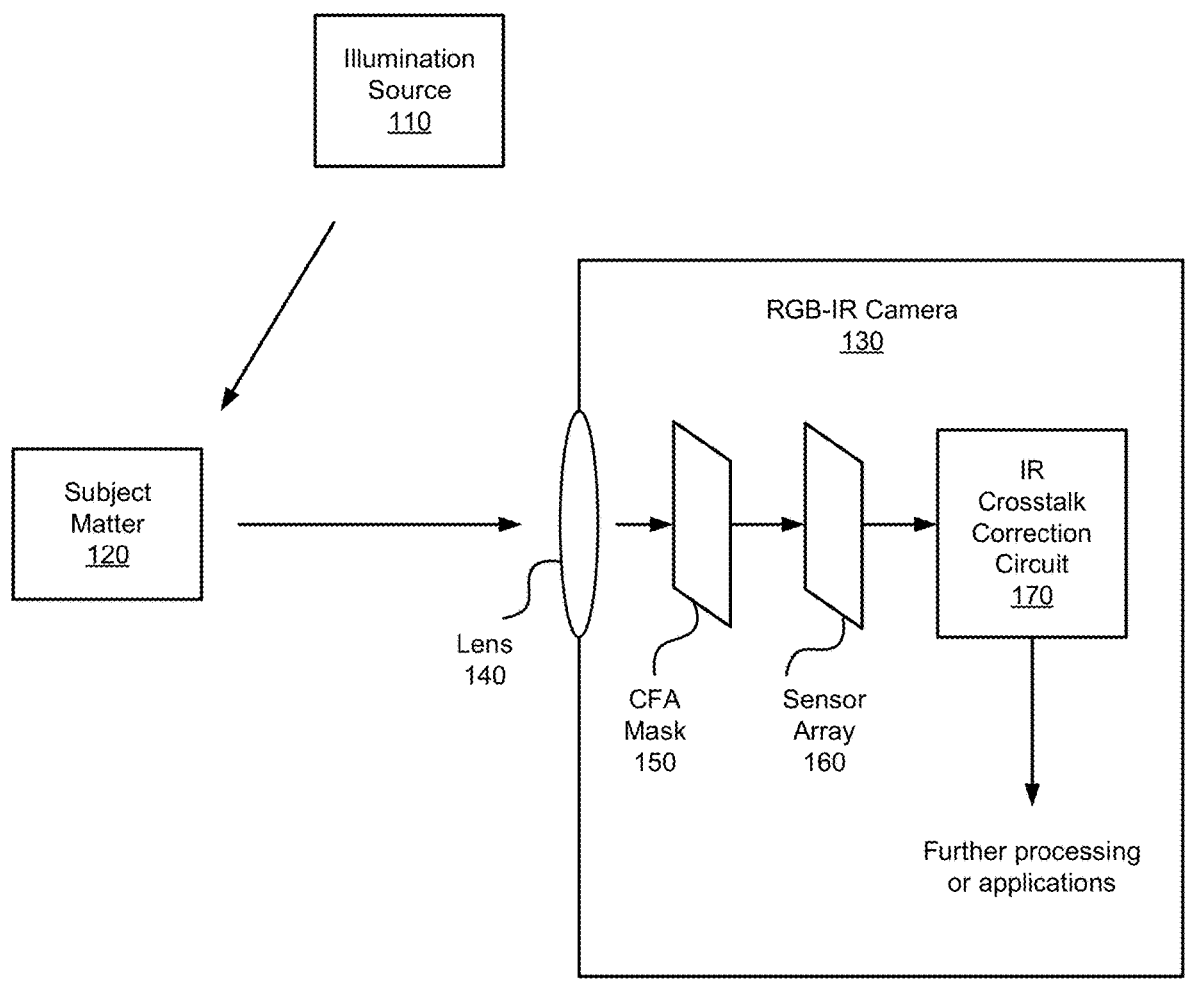
FIG. 1 illustrates an imaging scenario using an RGB-IR camera, configured in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided for correction of IR crosstalk in hybrid RGB-IR sensors which are configured to capture light in both the visible and infrared spectra. As previously noted, hybrid RGB-IR sensors, and the cameras that employ them, are particularly useful due to their capabilities to enhance traditional color imaging, provide improved daytime/nighttime vision, and support various machine vision applications, such as gesture sensing, face detection and recognition, iris detection and eye tracking. However, IR crosstalk between the IR channel and the RGB color channels of the sensor often causes color degradation, such as desaturation and color shifts, due to the interference of the IR component in each of the RGB color channels.

The disclosed techniques employ scalable models to efficiently estimate and correct the IR contamination in the RGB color channels of the captured image. These models may be employed, for example, both at the camera/sensor production/manufacturing stage and at the end user stage. In the former case, the camera manufacturer may calculate model-based correction factors (e.g., weights and adjustment values) for several reference illumination sources and use them as predetermined settings in the camera and/or imaging software or firmware. In the latter case, the camera user may obtain a new set of correction factors for specific capture conditions, for instance, if using production correction factors does not produce desired results. In either case, the obtained correction factors may be subject to scaling, offsetting, and/or other adjustments controlled by the user or performed automatically based on the actual image statistics, capture settings, and/or other predetermined instructions.

The disclosed techniques can be implemented, for example, in a computing system or a software product executable or otherwise controllable by such systems, although other embodiments will be apparent. The system or product is configured to perform IR crosstalk correction in an image captured using a hybrid RGB-IR sensor. In accordance with an embodiment, a methodology to implement these techniques includes estimating characteristics of the illumination that is applied to a subject (e.g., the scene content). The estimation is based on the image of the subject provided by the hybrid RGB-IR sensor. The image comprises a plurality of pixels, and each of the pixels is associated with an R, G, B, or IR channel. The method further includes selecting a set of correction model parameters from a calibration database. The selection is based on the estimated illumination characteristics and properties of the sensor. The correction model, based on the selected parameters, is employed to generate correction weights for each of the R, G, and B channels. The correction model may be a radial model, a piecewise linear model, or a higher-order polynomial model, as will be explained in greater detail below. The correction weights may vary in each pixel location for each of the R, G, and B channels of the image. The method further includes scaling the IR channel by each of the correction weights to generate correction values (e.g., adjustments) for each of the R, G, and B channels. The correction values are then applied to the RGB channels of the image to correct IR crosstalk between the IR channel and the RGB channels.

It will be appreciated that the techniques described herein may provide an efficient and scalable method for obtaining improved imaging results with more accurate color rendition, compared to existing techniques which require complex spectral decomposition, expensive calibration equipment, and computationally intensive color correction matrix calculations. The disclosed techniques can be implemented on a broad range of platforms including cameras, laptops, tablets, smart phones, instrumentation/measurement devices, or other imaging devices. Other applications will be apparent. These techniques may further be implemented in hardware or software or a combination thereof.

FIG. 1 illustrates an imaging application scenario 100 using an RGB-IR camera, configured in accordance with certain embodiments of the present disclosure. The scenario is shown to include an illumination source 110, a subject matter to be imaged 120, and an RGB-IR camera 130. The camera is further shown to include a lens 140, a color filter array (CFA) mask 150, a sensor array 160, and an IR crosstalk correction circuit 170.

The subject matter 120 may contain any number of objects and background regions (e.g., scene content) with varying reflective properties. For example, some objects may reflect IR illumination to a greater or lesser extent than other objects. The subject matter 120, is illuminated by an illumination source 110 which may exhibit spectral characteristics of any type. For example, tungsten light and natural daylight both contain significant proportions of IR radiation, while fluorescent light sources have negligible IR content. Thus, IR crosstalk can vary in each color channel since it is at least a function of both scene content and illumination.

Lens 140 focuses the reflected illumination from the subject matter 120 onto the CFA mask 150 which generates color channels (red, green, blue, and IR). The color channels are projected onto the sensor array 160 which is configured to generate a response to the radiation at each pixel of the sensor array, as will be explained in greater detail below. IR crosstalk correction circuit 170 is configured to process the pixel responses to reduce or correct crosstalk or contamination of the other color channels with the IR signal, as will also be explained in greater detail below.

Figure 2:
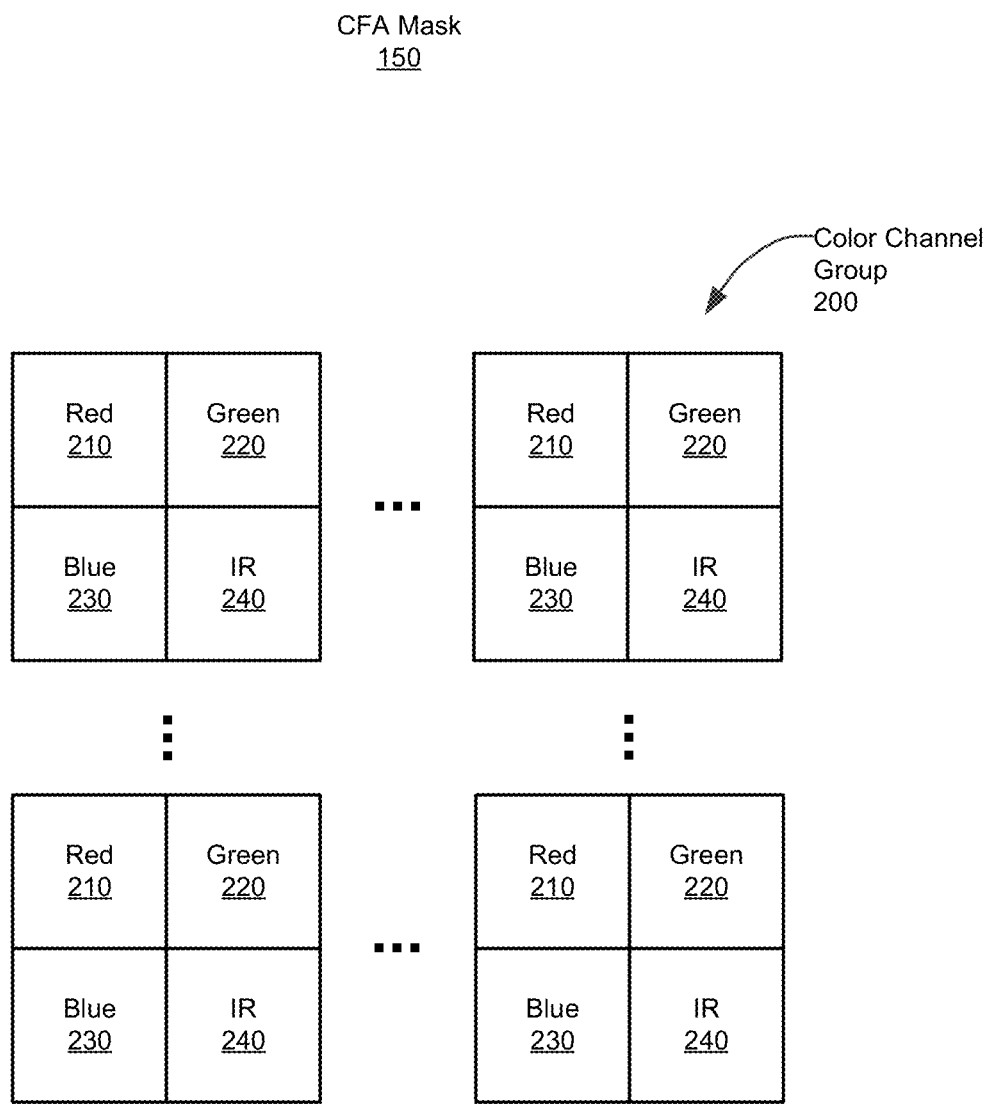
FIG. 2 is a diagram of a color filter array (CFA) mask, configured in accordance with certain embodiments of the present disclosure.

FIG. 2 is a more detailed diagram of the color filter array (CFA) mask 150, configured in accordance with certain embodiments of the present disclosure. The CFA mask 150 is shown to be configured as a two-dimensional array of color channel groups 200. Each group 200, also referred to as a repetitive CFA pattern, contains a red color filter 210, a green color filter 220, a blue color filter 230, and an IR color filter 240. The CFA mask separates color information and creates the color channels since each type of employed color filter has different spectral characteristics and passes the light through in a specific wavelength range. The geometric arrangement of R, G, B, and IR color filters as shown is merely illustrative of one example and can vary in other embodiments, as the color group can have different size (typically 2×2 or 4×4) and may contain more than one instance of the same color filter. The CFA mask 150 may comprise any desired number of color channel groups 200, depending on the sensor array dimensions.

Figure 3:
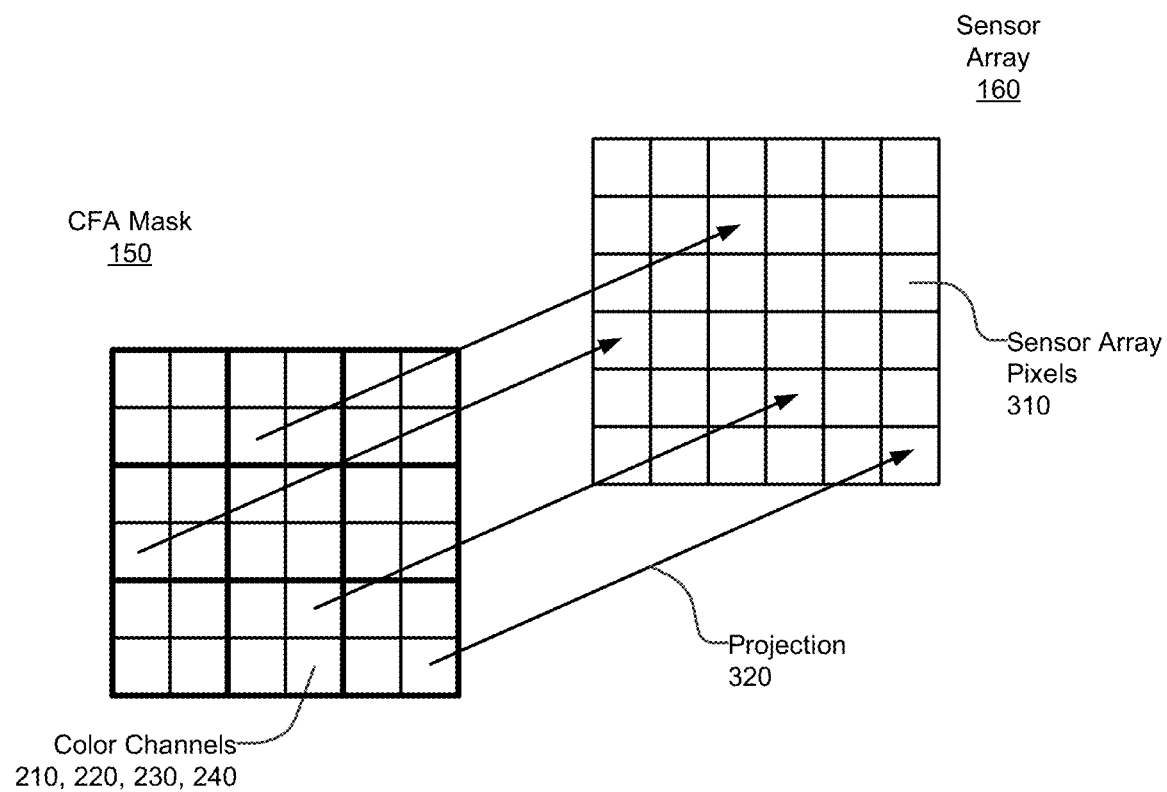
FIG. 3 is a diagram of the CFA mask and the sensor array, configured in accordance with certain embodiments of the present disclosure.

FIG. 3 is a diagram of the CFA mask 150 and the sensor array 160, configured in accordance with certain embodiments of the present disclosure. The sensor array 160 is shown to be configured as a two-dimensional array of pixels 310, each pixel corresponding to a detector of the sensor array. The sensor array may comprise of any number of pixels, for example depending on the resolution requirements for the image, and the constraints on size and cost of the device.

The configuration shown in FIG. 3 allows for each sensor array pixel to generate a response to one of the color channels R, G, B, or IR which are projected 320 onto the array. Since, unlike traditional RGB sensors, hybrid RGB-IR sensors do not have an IR blocking filter, the RGB color channels are usually contaminated with IR radiation, thus creating degradations referred to as IR crosstalk. Moreover, the IR signal may spill over to some extent into one of the adjacent RGB detection pixels. Both of these phenomena can adversely affect the image quality, causing color shifts, desaturation, and other degradations.

IR crosstalk will generally vary in each of the RGB color channels since it is a function of both scene content (e.g., some materials reflect more IR radiation than others) and illumination characteristics (e.g., tungsten light and natural daylight have relatively high IR radiation content, while fluorescent light sources have negligible IR radiation content). Additionally, the angle of incidence of the incoming light rays plays a role in these side-effects as the lens is often placed very close to the sensor, which thus receives light at steep angles at the boundaries of the pixel array. The IR crosstalk degradation therefore generally has a smooth, low-frequency, profile and is usually smallest at the optical center and increases towards to the sensor boundaries. Maintaining a desirable level of color accuracy (i.e., achieving approximately constant color appearance) across the image thus requires removing the IR component from the captured RGB data. This can be accomplished by using the response from the IR channel pixels as a reference of the degree of IR crosstalk received by the RGB color channel pixels.

A degradation model based on this approach can be characterized as:

$$I = J + f(X)$$

where I represents the actual (detected) R, G, or B pixel value provided by the sensor and J is the corresponding ideal (degradation-free) version to be estimated. The degradation term f(X) is a function of the actual (detected) IR pixel value denoted as X. The I and X terms are available products of the imaging process and a model of f(X) is estimated to find a suitable approximation of the degradation-free signal J. In some embodiments, X is obtained through interpolation using the captured IR pixels. In some embodiments, f(X) may be a weighting function w that is employed to apply an adjustment to each pixel depending on the location of the pixel on the sensor array, as will be explained in greater detail below. In such case, the degradation correction model can be rewritten as:

$$I = J | wX$$

Thus, the correction weights w=(I−J)/X are equivalent to a difference between the actual and degradation-free pixels scaled by the value of the corresponding IR pixel.

Figure 4:
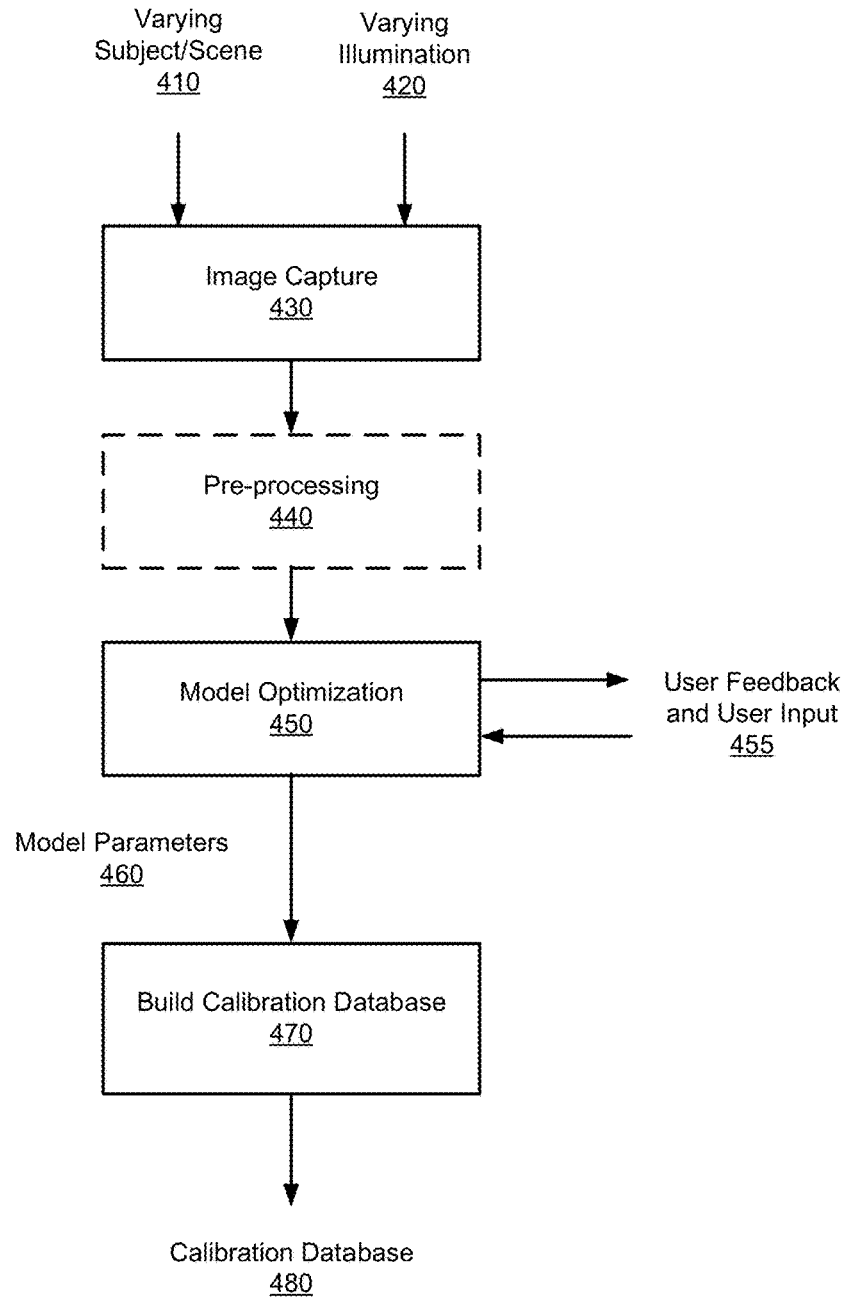
FIG. 4 is a block diagram illustrating the generation of a calibration database, in accordance with certain embodiments of the present disclosure.

FIG. 4 is a block diagram 400 illustrating the generation of a calibration database 480, in accordance with certain embodiments of the present disclosure. As will be described later, in connection with FIG. 5, certain embodiments of the IR crosstalk correction circuit 170 employ a parametric model that can be used to calculate correction weights w to correct for IR crosstalk in the image. The parameters for that model may be selected from a calibration database 480, for example during operation of the sensor or camera in real-time or near real-time. The calibration database 480, however, may be pre-generated in an offline fashion, for example during the manufacture or configuration of the sensor or camera, as described herein. The calibration database 480 contains model parameters 460 associated with each type of sensor and for varying illumination conditions.

In some embodiments, for each type of sensor of interest, a number of images are captured 430 of different subjects/scenes 410 under varying illumination conditions 420. These images may be captured in a controlled environment and/or during random field test imaging. The captured images may be subject to any desired pre-processing operations 440. These may include, for example, white-balancing, color correction, gamma correction, cropping, offset (black level) correction, defective pixel correction, spatial filtering (to remove outliers and suppress pixel noise), and/or frame averaging (to reduce temporal noise) when more than one image of the same scene is available.

Model optimization 450 is performed on the resulting captured and/or preprocessed image to generate model parameters 460. In some embodiments, model optimization may include mathematical minimization of some suitable objective function (e.g., spatially uniform response after IR crosstalk and lens shading correction) to find optimal correction factors. In some embodiments, model optimization may further include user (e.g., calibration technician) control of parameter adjustments based on feedback of results to user 455. This can be based on perceptually meaningful criteria (e.g., various human perception-driven metrics and image quality indices). In some embodiments, model optimization may be based on a manual setting of correction model parameters or correction factors by the user/observer based on one or more subjective criteria.

As the appropriate model parameters 460 are generated, a build 470 of the calibration database 480 may be performed. The calibration database 480 may be formatted in any suitable manner. In some embodiments, for example, the database may be indexed by sensor type, and illumination characteristics, such as percentage of IR radiation and/or color temperature.

The parametrization of correction factors for storage in the calibration database 480 produces correction model parameters and reduces memory requirements compared to storing the entire set of correction factors (e.g., for every pixel). The parameterization also allows for scalability, as the correction factors can later be calculated for any desired sensor or image size using the correction model parameters, as will be explained below.

Figure 5:
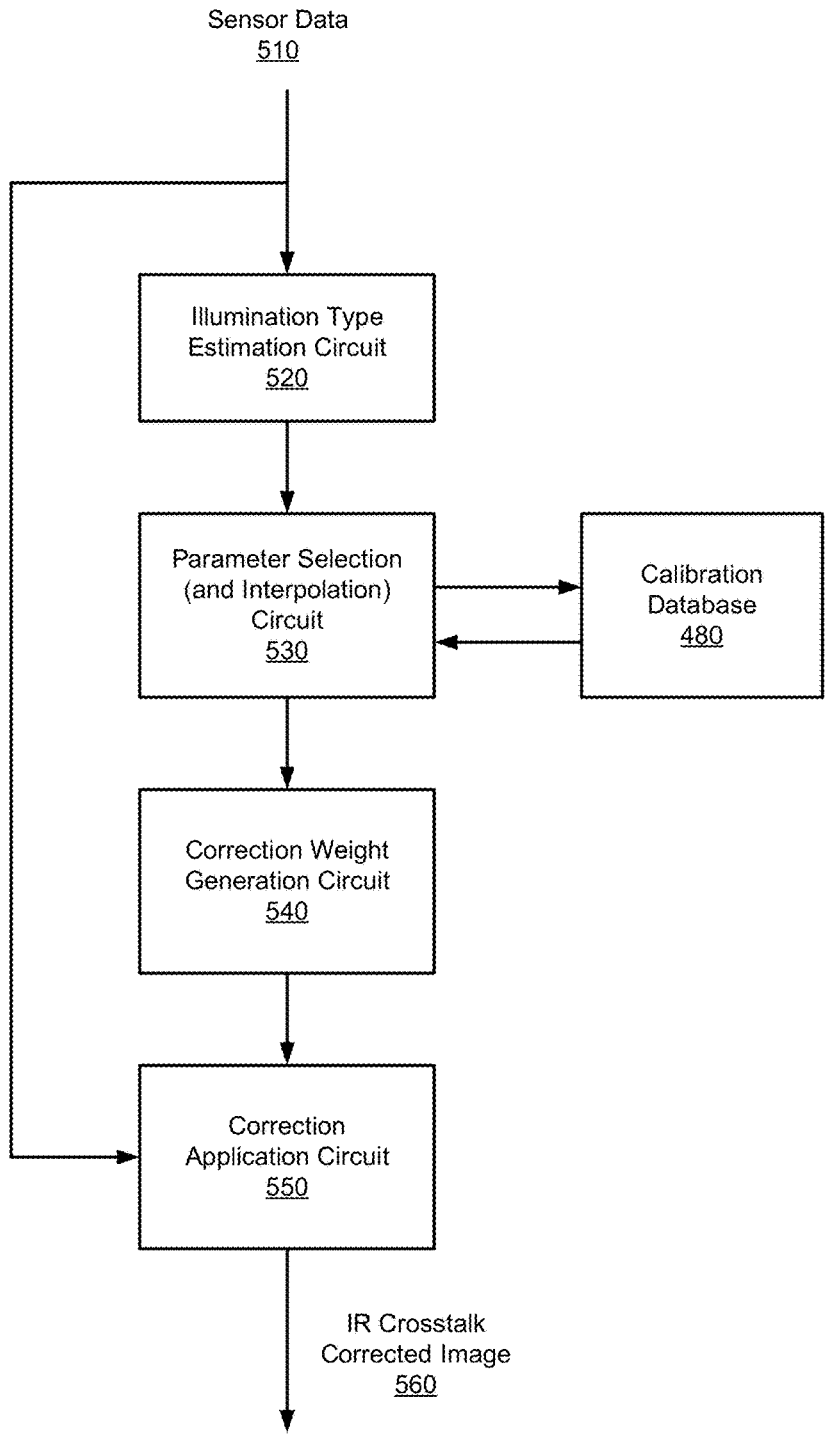
FIG. 5 is a block diagram of an IR crosstalk correction circuit, configured in accordance with certain embodiments of the present disclosure.

FIG. 5 is a block diagram of an IR crosstalk correction circuit 170, configured in accordance with certain embodiments of the present disclosure. The IR crosstalk correction circuit 170 is shown to include an illumination type estimation circuit 520, a parameter selection (and interpolation) circuit 530, the calibration database 480, a correction weight generation circuit 540, and a correction application circuit 550.

The illumination type estimation circuit 520 is configured to estimate characteristics of illumination applied to a subject (or the scene), the estimation based on an image of the subject provided by a hybrid Red-Green-Blue-IR (RGB-IR) sensor, the image comprising a plurality of pixels, the pixels associated with RGB-IR channels. The characteristics of illumination may include the percentage of IR radiation, the color temperature, and/or other suitable measures that are related to the degree and nature of IR crosstalk. The estimation of illumination characteristics may be performed using known techniques, in light of the present disclosure.

The parameter selection (and interpolation) circuit 530 is configured to select a set of correction model parameters from a calibration database based on the estimated illumination characteristics. In some embodiments, the parameter selection circuit is further configured to select the set of correction model parameters from the calibration database based on predetermined properties of the RGB-IR sensor, the predetermined properties including sensor geometry, sensor materials, and lens position relative to the sensor. In some embodiments, the sensor characteristics may be associated with a sensor ID, and the database may be indexed by that sensor ID for ease of searching and retrieval.

In some cases, where the estimated illumination characteristics do not match an entry in the calibration database to a desired degree of similarity, the parameter selection circuit may select a first and second set of predetermined correction model parameters from the calibration database and interpolate between the first and second sets of correction model parameters to generate parameters for use in the generation of the correction model. In some other embodiments, the parameter selection circuit may select a set of predetermined correction model parameters which are closest to the actual illumination. In some embodiments, these estimated illumination characteristics may be subject to illuminant-driven interpolation to obtain the correction parameters for the actual image based on the illumination estimated using white point information (e.g., the chromaticity of a white object under the illumination) and the relative amounts of IR signal and individual color (RGB) signals, in order to differentiate between light sources with similar spectral characteristics but different IR content.

The correction weight generation circuit 540 is configured to generate the correction weights for the RGB channels of the pixels of the image, based on the selected set of correction model parameters. In some embodiments, the correction model may be a radial model, a piecewise linear model, and/or a higher-order polynomial model. The radial model may be expressed as an equation to generate a correction weights w for the RGB channels of any given pixel location (i,j) as a function of the distance from the optical center of the image, based on a small number of control parameters. In some embodiments, the radial model may be expressed by the following equation, which is based on a Gaussian profile:

$$w_k(i, j) = \min\left(\phi_k, 1 - \exp_k\left(-\frac{[\beta_k(i - c_v)/H]^2 + [\gamma_k(j - c_h)/W]^2}{\sigma_k}\right) + \alpha_k\right)$$

where k denotes the color channel (e.g., 1-3 for R, G, and B). For an image of height H and width W, i and j range from $0 < i \leq H$ and $0 < j \leq W$. Additionally, $c_v = H/2$ and $c_h = W/2$ refer to the optical center of the image and can be adjusted (e.g., through calibration) to represent the true optical center rather than the center of the image. Parameters $\sigma_k$ and $\alpha_k$ are sigma and offset parameters for the Gaussian profile, $\beta_k$ and $\gamma_k$ are normalization/deformation parameters in the vertical and horizontal directions of the image, and $\phi_k$ sets a limit on the maximum allowable correction factor value. These parameters may be obtained through mathematical optimization or heuristically determined, typically during the generation of the calibration database 480, or based on user feedback related to the quality of the images being obtained.

In some embodiments, $\beta_k$ and $\gamma_k$ are proportional to the sensor dimensions. In some embodiments, these parameters can have arbitrary values to deform (e.g., stretch or squeeze) the correction model to better approximate the degradation. In general, these parameters are selected to be small enough to $\sigma_k$ values in a practical range for various implementations (e.g., for fixed point arithmetic implementations). The term $\exp_k(x) = \theta_k^{(x)}$ and denotes the power function (e.g., $\theta_k$ is approximately 2.71 for the exponential function). In some embodiments, for example depending on the implementation approach, the weighting factor $w_k(i,j)$ is normalized to a desired range (e.g., from zero to one, or other suitable values).

In some embodiments, the correction model may be a piecewise linear model in which the image is subdivided into a number of (possibly overlapping) blocks. One correction weight is calculated for each block (for example using the radial model or block-based offline calibration) and then linear interpolation is used to fill in the correction weights between neighboring blocks. In some embodiments, the correction model may be a higher-order polynomial model. This is similar to the piecewise linear model except that higher-order polynomial interpolation is used. In some embodiments, captured images or arrays of correction weights may be down-sampled and the correction weights for the original (pre-down-sampled) pixel locations are interpolated from the down-sampled array of correction weights.

The correction application circuit 550 is configured to generate correction values and apply them to the image to correct IR crosstalk in the RGB channels of the pixels of the image. Each of the RGB correction weights are employed to scale (or otherwise combine with) the value of the IR channel, of each image pixel, to generate a correction value for the associated RGB channel of that pixel. The RGB channels are then adjusted by the correction value. For example, the corrected Red channel is calculated by subtracting the Red correction value from the red channel, the corrected Blue channel is calculated by subtracting the Blue correction value from the Blue channel, and the corrected Green channel is calculated by subtracting the Green correction value from the Green channel. In some other embodiments, the RGB channels may be adjusted by the correction value through multiplicative scaling rather than subtraction.

Figure 6:
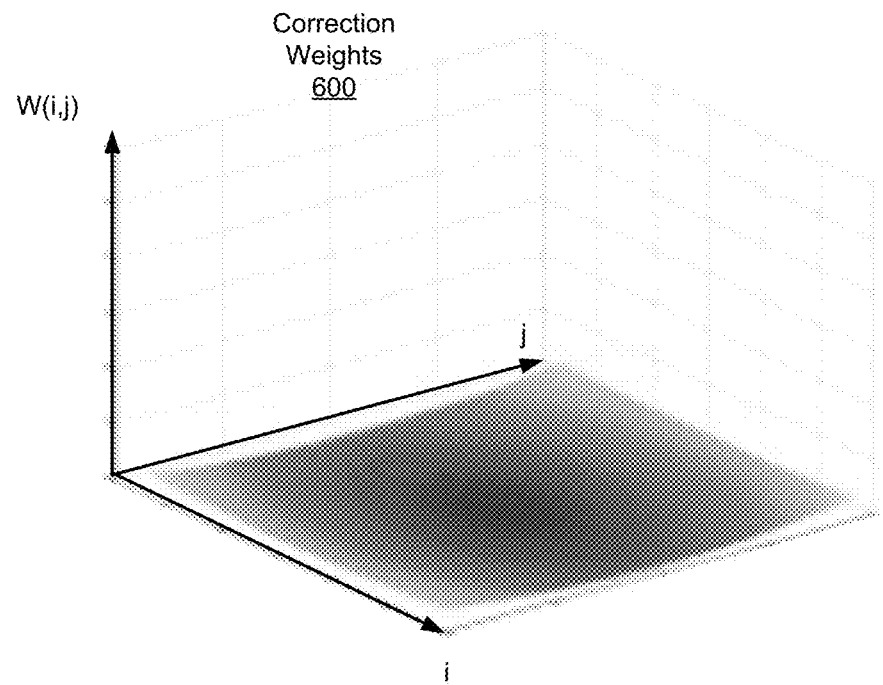
FIG. 6 illustrates example plots of correction weights, in accordance with certain embodiments of the present disclosure.
Figure 6:
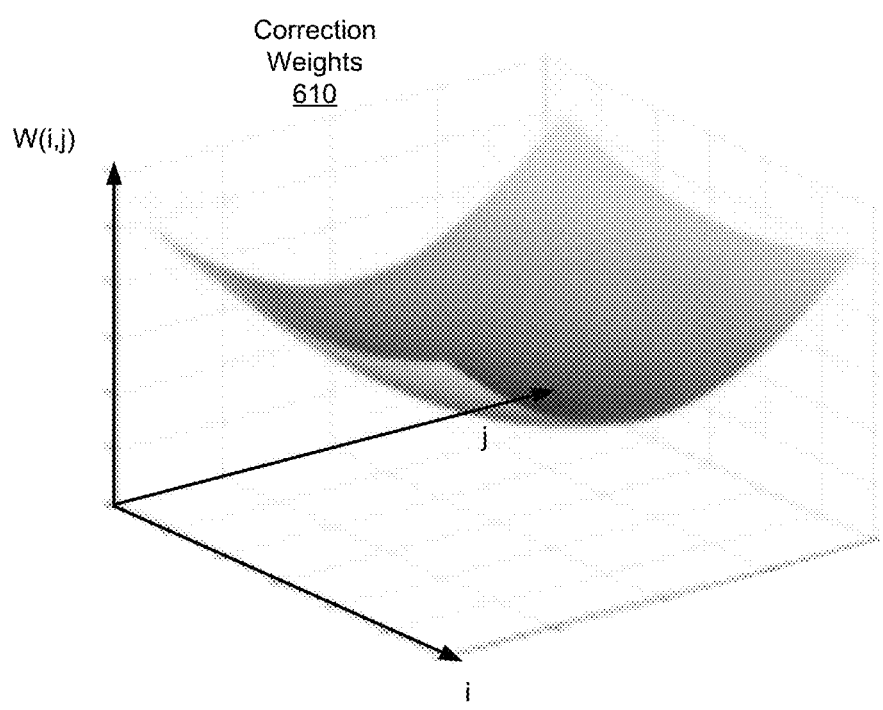

FIG. 6 illustrates example plots 600 and 610 of correction weights w(i,j) associated with the radial correction model, in accordance with certain embodiments of the present disclosure. The example plot 600 is associated with a scenario involving negligible IR crosstalk, for example using fluorescent light sources, and is relatively flat and close to zero indicating that little correction is needed. The example plot 610 is associated with a scenario involving significant IR crosstalk, induced for example by tungsten illumination sources, and shows greater correction values and a more concave surface indicating that larger adjustments are appropriate, particularly near the image boundaries.

Figure 7:
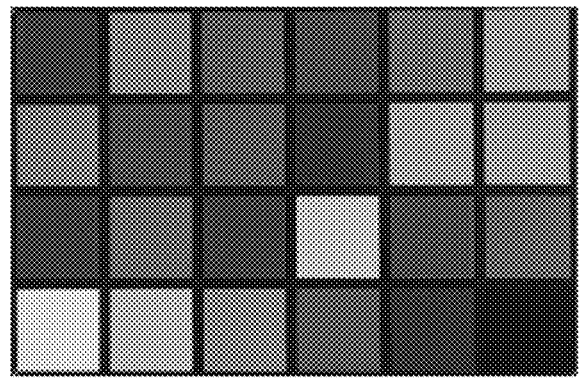
FIG. 7 illustrates an example image before and after IR crosstalk correction, in accordance with certain embodiments of the present disclosure.
Figure 7:
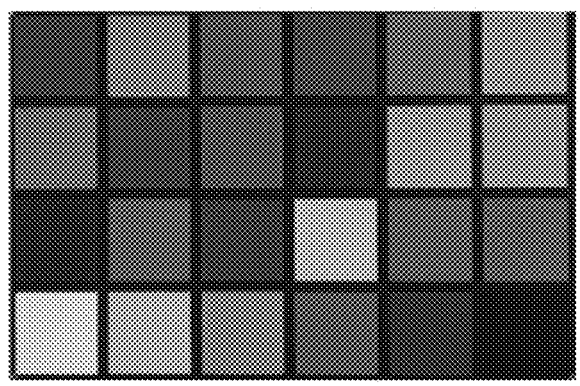

FIG. 7 illustrates IR crosstalk correction of an example image, in accordance with certain embodiments of the present disclosure. Image 700 shows a color checker image before correction and image 710 shows the image after correction. As can be seen, application of the disclosed techniques to suppressing IR crosstalk provides significant improvement in color accuracy (by correcting purple cast and desaturation), especially under the IR-rich illumination.

Methodology

Figure 8:
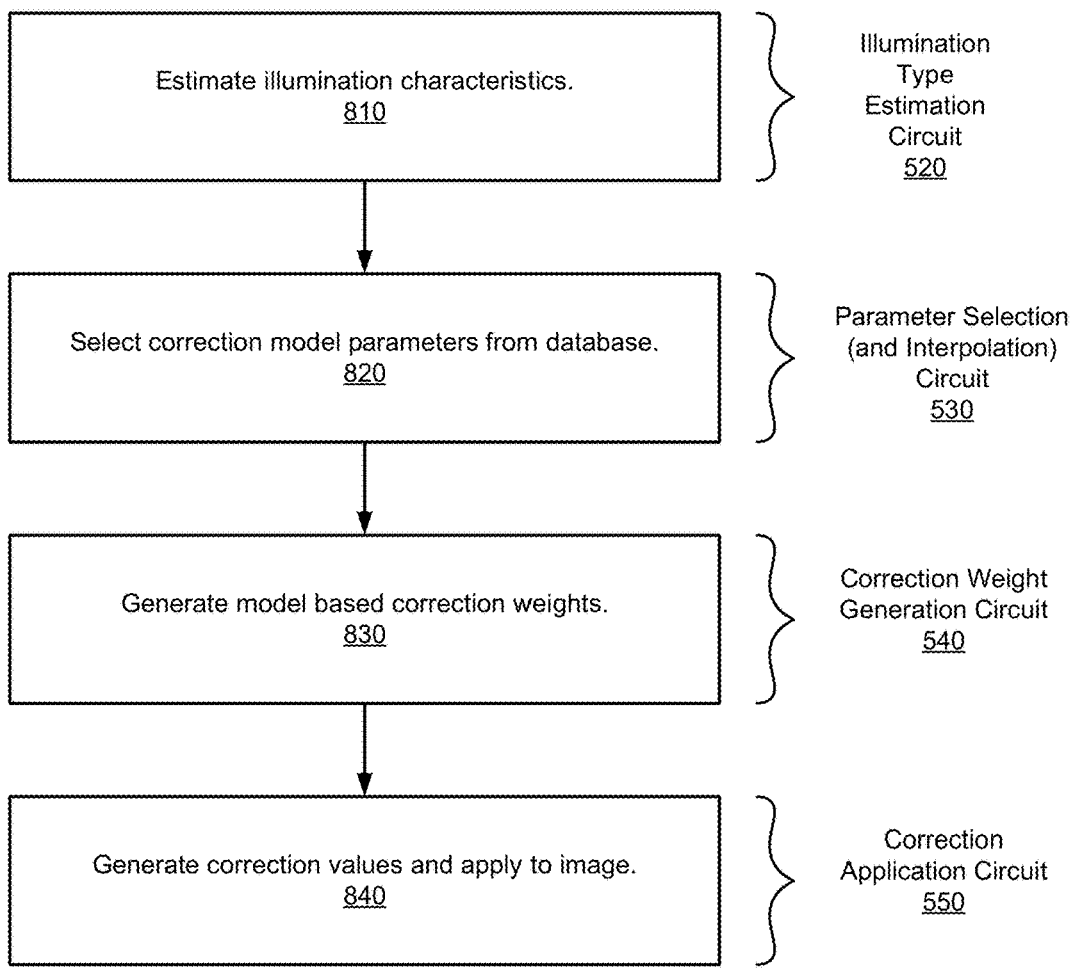
FIG. 8 is a flowchart illustrating a methodology for IR crosstalk correction, in accordance with certain embodiments of the present disclosure.

FIG. 8 is a flowchart illustrating an example method 800 for efficient IR crosstalk correction of a hybrid RGB-IR sensor with improved results compared to existing techniques, in accordance with certain embodiments of the present disclosure. As can be seen, the example method includes a number of phases and sub-processes, the sequence of which may vary from one embodiment to another. However, when considered in the aggregate, these phases and sub-processes form a process for IR crosstalk correction, in accordance with certain of the embodiments disclosed herein. These embodiments can be implemented, for example, using the system architecture illustrated in FIGS. 1-5, as described above. However other system architectures can be used in other embodiments, as will be apparent in light of this disclosure. To this end, the correlation of the various functions shown in FIG. 8 to the specific components illustrated in the other figures is not intended to imply any structural and/or use limitations. Rather, other embodiments may include, for example, varying degrees of integration wherein multiple functionalities are effectively performed by one system. For example, in an alternative embodiment a single module having decoupled sub-modules can be used to perform all of the functions of method 800. Thus, other embodiments may have fewer or more modules and/or sub-modules depending on the granularity of implementation. In still other embodiments, the methodology depicted can be implemented as a computer program product including one or more non-transitory machine-readable mediums that when executed by one or more processors cause the methodology to be carried out. Numerous variations and alternative configurations will be apparent in light of this disclosure.

As illustrated in FIG. 8, in an embodiment, method 800 for IR crosstalk correction commences by estimating, at operation 810, characteristics of illumination applied to a subject. The estimation is based on an image of the subject provided by the hybrid Red-Green-Blue-IR (RGB-IR) sensor. The image comprises a plurality of pixels, each of the pixels associated with one of the RGB-IR channels, as previously described. In some embodiments, the characteristics of illumination include at least one of a percentage of IR radiation in the illumination and a white point of the illumination.

Next, at operation 820, a set of correction model parameters is selected from a calibration database based on the estimated illumination characteristics.

At operation 830, correction weights for each of the R, G, and B channels are generated from the correction model based on the selected set of correction model parameters. In some embodiments, the correction model may be a radial model, a piecewise linear model, or a higher-order polynomial model.

At operation 840, correction values are generated and applied to the image. For example, the IR channel is scaled by each of the correction weights to generate correction values (e.g., adjustments) for each of the R, G, and B channels. The correction values are then applied to the RGB channels of the image to correct IR crosstalk between the IR channel and the RGB channels.

Of course, in some embodiments, additional operations may be performed, as previously described in connection with the system. For example, selecting the set of correction model parameters from the calibration database may additionally be based on predetermined properties of the RGB-IR sensor, such as sensor geometry, sensor material, and lens position relative to the sensor. In some embodiments, selecting the set of correction model parameters from the calibration database may include interpolation between two or more entries in the database, for example if a suitable entry cannot be found in the database.

Example System

Figure 9:
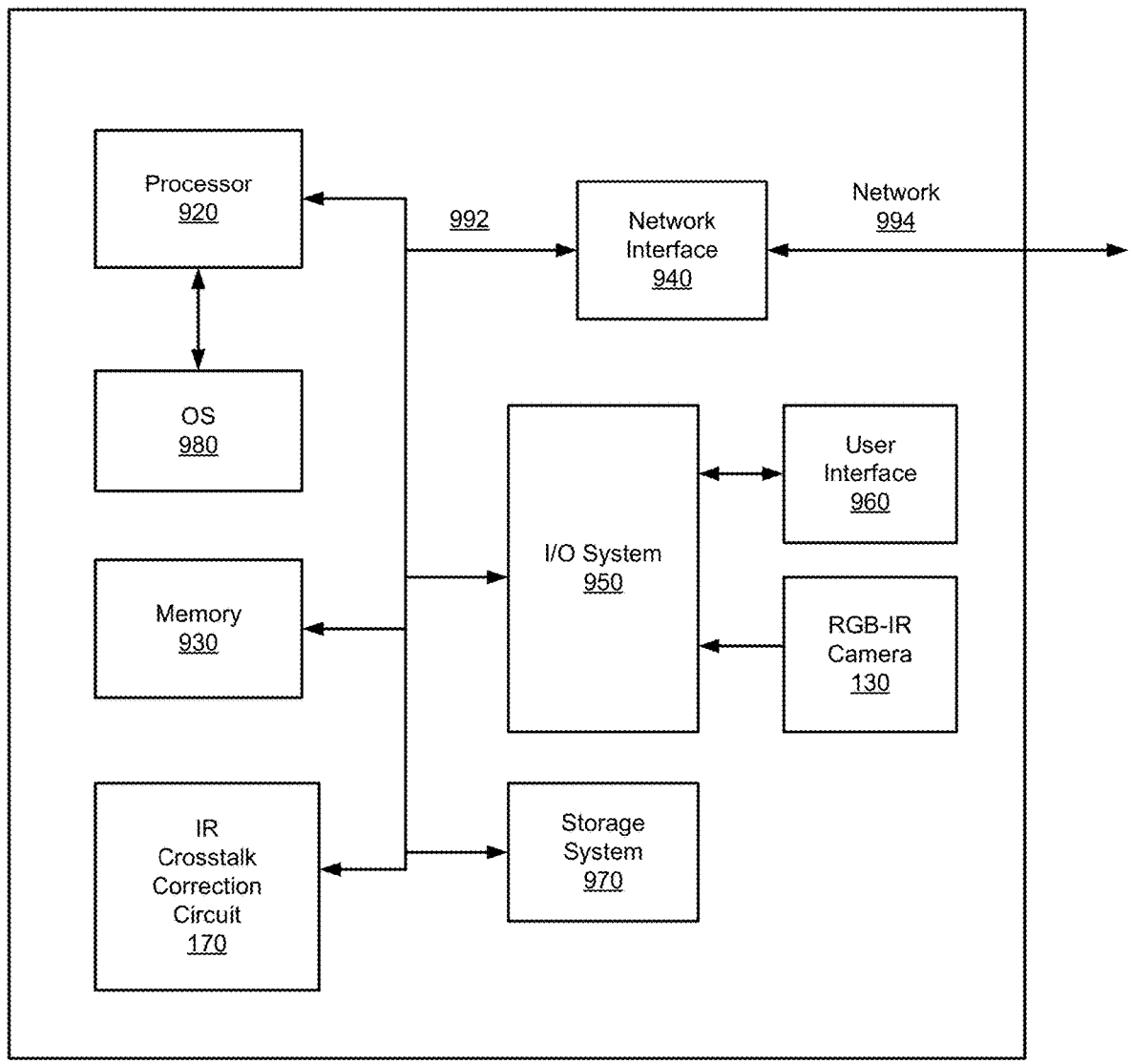
FIG. 9 is a block diagram schematically illustrating a platform configured to perform IR crosstalk correction, in accordance with certain embodiments of the present disclosure.

FIG. 9 illustrates an example platform 900, configured in accordance with certain embodiments of the present disclosure, to perform IR crosstalk correction for a hybrid RGB-IR sensor. In some embodiments, platform 900 may be hosted on, or otherwise be incorporated into an imaging device, camera, personal computer, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, wearable device, and so forth. Any combination of different devices may be used in certain embodiments.

In some embodiments, platform 900 may comprise any combination of a processor 920, a memory 930, IR crosstalk correction circuit 170, a network interface 940, an input/output (I/O) system 950, a user interface 960, an RGB-IR camera 130, and a storage system 970. As can be further seen, a bus and/or interconnect 992 is also provided to allow for communication between the various components listed above and/or other components not shown. Platform 900 can be coupled to a network 994 through network interface 940 to allow for communications with other computing devices, platforms, devices to be controlled, or other resources. Other componentry and functionality not reflected in the block diagram of FIG. 9 will be apparent in light of this disclosure, and it will be appreciated that other embodiments are not limited to any particular hardware configuration.

Processor 920 can be any suitable processor, and may include one or more coprocessors or controllers, such as an audio processor, a graphics processing unit, or hardware accelerator, to assist in control and processing operations associated with platform 900. In some embodiments, the processor 920 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 920 may be implemented as a complex instruction set computer (CISC) or a reduced instruction set computer (RISC) processor. In some embodiments, processor 920 may be configured as an x86 instruction set compatible processor.

Memory 930 can be implemented using any suitable type of digital storage including, for example, flash memory and/or random-access memory (RAM). In some embodiments, the memory 930 may include various layers of memory hierarchy and/or memory caches as are known to those of skill in the art. Memory 930 may be implemented as a volatile memory device such as, but not limited to, a RAM, dynamic RAM (DRAM), or static RAM (SRAM) device. Storage system 970 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 970 may comprise technology to increase the storage performance enhanced protection for valuable digital media when multiple hard drives are included.

Processor 920 may be configured to execute an Operating System (OS) 980 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 900, and therefore may also be implemented using any suitable existing or subsequently-developed platform.

Network interface circuit 940 can be any appropriate network chip or chipset which allows for wired and/or wireless connection between other components of device platform 900 and/or network 994, thereby enabling platform 900 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 950 may be configured to interface between various I/O devices and other components of device platform 900. I/O devices may include, but not be limited to, user interface 960 and RGB-IR camera 130. User interface 960 may include devices (not shown) such as a speaker, microphone, display element, touchpad, keyboard, and mouse, etc. I/O system 950 may include a graphics subsystem configured to perform processing of images for rendering on the display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 920 or any chipset of platform 900.

It will be appreciated that in some embodiments, the various components of platform 900 may be combined or integrated in a system-on-a-chip (SoC) architecture. In some embodiments, the components may be hardware components, firmware components, software components or any suitable combination of hardware, firmware or software.

IR crosstalk correction circuit 170 is configured to provide efficient IR crosstalk correction of a hybrid RGB-IR sensor with improved results compared to existing techniques, as described previously. IR crosstalk correction circuit 170 may include any or all of the circuits/components illustrated in FIGS. 1-5, as described above. These components can be implemented or otherwise used in conjunction with a variety of suitable software and/or hardware that is coupled to or that otherwise forms a part of platform 900. These components can additionally or alternatively be implemented or otherwise used in conjunction with user I/O devices that are capable of providing information to, and receiving information and commands from, a user.

In some embodiments, these circuits may be installed local to platform 900, as shown in the example embodiment of FIG. 9. Alternatively, platform 900 can be implemented in a client-server arrangement wherein at least some functionality associated with these circuits is provided to platform 900 using an applet, such as a JavaScript applet, or other downloadable module or set of sub-modules. Such remotely accessible modules or sub-modules can be provisioned in real-time, in response to a request from a client computing system for access to a given server having resources that are of interest to the user of the client computing system. In such embodiments, the server can be local to network 994 or remotely coupled to network 994 by one or more other networks and/or communication channels. In some cases, access to resources on a given network or computing system may require credentials such as usernames, passwords, and/or compliance with any other suitable security mechanism.

In various embodiments, platform 900 may be implemented as a wireless system, a wired system, or a combination of both. When implemented as a wireless system, platform 900 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 900 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the IR crosstalk correction methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 994. In other embodiments, the functionalities disclosed herein can be incorporated into other voice-enabled devices and speech-based software applications, such as, for example, smart-home management, entertainment, robotic applications, and IoT device applications. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 900 may comprise additional, fewer, or alternative subcomponents as compared to those included in the example embodiment of FIG. 9.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is at least one non-transitory computer readable storage medium having instructions encoded thereon that, when executed by one or more processors, cause a process to be carried out for infrared (IR) crosstalk correction in Red-Green-Blue (RGB) color channels, the process comprising: estimating characteristics of illumination applied to a subject, the estimation based on an image of the subject captured by a hybrid RGB-IR sensor, the image comprising a plurality of pixels, the pixels associated with RGB-IR channels; selecting a set of correction model parameters based on the estimated illumination characteristics; generating correction weights for the RGB channels, from a correction model, the generation based on the selected set of correction model parameters; generating correction values for the RGB channels, based on a combination of the correction weights and the IR channel; and adjusting the RGB channels by the correction values to reduce IR crosstalk between the IR channel and the RGB channels.

Example 2 includes the subject matter of Example 1, wherein the generation of the correction values is based on a product of the correction weights and the IR channel.

Example 3 includes the subject matter of Examples 1 or 2, wherein the adjusting of the RGB channels comprises at least one of subtracting the correction values from the RGB channels and scaling the RGB channels by the correction values.

Example 4 includes the subject matter of any of Examples 1-3, wherein the correction model is at least one of a radial model, a piecewise linear model, and a higher-order polynomial model.

Example 5 includes the subject matter of any of Examples 1-4, wherein the estimated characteristics of illumination include at least one of a percentage of IR radiation in the RGB channels and a white point of the illumination.

Example 6 includes the subject matter of any of Examples 1-5, further comprising the operation of selecting the set of correction model parameters based on predetermined properties of the RGB-IR sensor, the predetermined properties including at least one of sensor geometry, sensor material, and lens position relative to the sensor.

Example 7 includes the subject matter of any of Examples 1-6, wherein the selecting of the set of correction model parameters further comprises at least one of selecting a nearest set of predetermined calibration parameters and interpolating between two or more sets of predetermined calibration parameters.

Example 8 is a system for infrared (IR) crosstalk correction in Red-Green-Blue (RGB) color channels, the system comprising: an illumination estimation circuit to estimate characteristics of illumination applied to a subject, the estimation based on an image of the subject captured by a hybrid RGB-IR sensor, the image comprising a plurality of pixels, the pixels associated with RGB-IR channels; a parameter selection circuit to select a set of correction model parameters based on the estimated illumination characteristics; a correction weight generation circuit to generate correction weights for the RGB channels, from a correction model, the generation based on the selected set of correction model parameters; and a correction application circuit to generate correction values for the RGB channels, based on a combination of the correction weights and the IR channel, and to adjust the RGB channels by the correction values to reduce IR crosstalk between the IR channel and the RGB channels.

Example 9 includes the subject matter of Example 8, wherein the generation of the correction values is based on a product of the correction weights and the IR channel.

Example 10 includes the subject matter of Examples 8 or 9, wherein the adjusting of the RGB channels comprises at least one of subtracting the correction values from the RGB channels and scaling the RGB channels by the correction values.

Example 11 includes the subject matter of any of Examples 8-10, wherein the correction model is at least one of a radial model, a piecewise linear model, and a higher-order polynomial model.

Example 12 includes the subject matter of any of Examples 8-11, wherein the estimated characteristics of illumination include at least one of a percentage of IR radiation in the RGB channels and a white point of the illumination.

Example 13 includes the subject matter of any of Examples 8-12, wherein the parameter selection circuit is further to select the set of correction model parameters based on predetermined properties of the RGB-IR sensor, the predetermined properties including at least one of sensor geometry, sensor material, and lens position relative to the sensor.

Example 14 includes the subject matter of any of Examples 8-13, wherein the parameter selection circuit is further to select the set of correction model parameters based on at least one of a nearest set of predetermined calibration parameters and interpolation between two or more sets of predetermined calibration parameters.

Example 15 is a processor-implemented method for infrared (IR) crosstalk correction in Red-Green-Blue (RGB) color channels, the method comprising: estimating, by a processor-based system, characteristics of illumination applied to a subject, the estimation based on an image of the subject captured by a hybrid RGB-IR sensor, the image comprising a plurality of pixels, the pixels associated with RGB-IR channels; selecting, by the processor-based system, a set of correction model parameters based on the estimated illumination characteristics; generating, by the processor-based system, correction weights for the RGB channels, from a correction model, the generation based on the selected set of correction model parameters; generating, by the processor-based system, correction values for the RGB channels, based on a combination of the correction weights and the IR channel; and adjusting, by the processor-based system, the RGB channels by the correction values to reduce IR crosstalk between the IR channel and the RGB channels.

Example 16 includes the subject matter of Example 15, wherein the generation of the correction values is based on a product of the correction weights and the IR channel.

Example 17 includes the subject matter of Examples 15 or 16, wherein the adjusting of the RGB channels comprises at least one of subtracting the correction values from the RGB channels and scaling the RGB channels by the correction values.

Example 18 includes the subject matter of any of Examples 15-17, wherein the correction model is at least one of a radial model, a piecewise linear model, and a higher-order polynomial model.

Example 19 includes the subject matter of any of Examples 15-18, wherein the estimated characteristics of illumination include at least one of a percentage of IR radiation in the RGB channels and a white point of the illumination.

Example 20 includes the subject matter of any of Examples 15-19, further comprising the operation of selecting the set of correction model parameters based on predetermined properties of the RGB-IR sensor, the predetermined properties including at least one of sensor geometry, sensor material, and lens position relative to the sensor.

Example 21 includes the subject matter of any of Examples 15-20, wherein the selecting of the set of correction model parameters further comprises at least one of selecting a nearest set of predetermined calibration parameters and interpolating between two or more sets of predetermined calibration parameters.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. At least one storage device comprising instructions that, when executed, cause one or more processors to:
estimate illumination characteristics of an image of a subject based on a signal output by a hybrid Red-Green-Blue Infrared (RGB-IR) sensor, the signal corresponding to a plurality of pixels, respective ones of the pixels associated with a Red channel, a Green Channel, a Blue Channel, or an infrared (IR) channel;
select a set of correction model parameters from a plurality of stored sets of correction model parameters based on the estimated illumination characteristics;
execute, based on the selected set of correction model parameters, a correction model to generate correction weights for the Red channel, the Green channel, and the Blue channel, respectively, the correction model to define the respective correction weights based on a size of the image and a location of an optical center of the image;
generate correction values for the Red channel, the Green channel, and the Blue channel, respectively, based on an IR channel value and corresponding ones of the correction weights, the correction weights different than the IR channel value; and adjust the Red channel, the Green channel, and the Blue channel based on the corresponding ones of the correction values to reduce IR crosstalk between the IR channel and the Red channel, the Green channel, and the Blue channel.

2. The at least one storage device of claim 1, wherein the instructions cause the one or more processors to generate the respective correction values based on a product of the IR channel value and the corresponding correction weight for the Red channel, the Green channel, or the Blue channel.

3. The at least one storage device of claim 1, wherein the instructions cause the one or more processors to adjust the Red channel, the Green channel, and the Blue channel by at least one of (a) subtracting the respective correction values from corresponding values of the Red channel, the Green channel, and the Blue channel or (b) scaling the respective values of the Red channel, the Green channel, and the Blue channel by the corresponding correction values.

4. The at least one storage device of claim 1, wherein the correction model is at least one of a radial model, a piecewise linear model, or a higher-order polynomial model.

5. The at least one storage device of claim 1, wherein the estimated illumination characteristics include at least one of a percentage of IR radiation in the Red channel, the Green channel, and the Blue channel, respectively, or a white point of the illumination.

6. The at least one storage device of claim 1, wherein the instructions cause the one or more processors to select the set of correction model parameters based on at least one of a geometry of the RGB-IR sensor, a material of the RGB-IR sensor, or a position of a lens relative to the RGB-IR sensor.

7. The at least one storage device of claim 1, wherein the instructions cause the one or more processors to select the set of correction model parameters by at least one of (a) selecting a set of calibration parameters associated with a known illumination characteristic or (b) interpolating two or more sets of calibration parameters.

8. A system comprising:
an illumination estimation circuit to estimate illumination characteristics of an image of a subject based on a signal output by a hybrid Red-Green-Blue Infrared (RGB-IR) sensor, the signal corresponding to a plurality of pixels, respective ones of the pixels associated with a Red channel, a Green Channel, a Blue Channel, or an IR channel;
a parameter selection circuit to select a set of correction model parameters from a plurality of stored sets of correction model parameters based on the estimated illumination characteristics;
a correction weight generation circuit to execute, based on the selected set of correction model parameters, a correction model to generate correction weights for the Red channel, the Green channel, and the Blue channel, respectively, the correction model to define the respective correction weights based on a size of the image and a location of an optical center of the image; and
a correction application circuit to:
generate correction values for the Red channel, the Green channel, and the Blue channel, respectively, based on an IR channel value and corresponding ones of the correction weights, the correction weights different than the IR channel value; and
adjust the Red channel, the Green channel, and the Blue channel based on the corresponding ones of the correction values to reduce IR crosstalk between the IR channel and the Red channel, the Green channel, and the Blue channel.

9. The system of claim 8, wherein the correction application circuit is to generate the respective correction values based on a product of the IR channel value and the corresponding correction weight for the Red channel, the Green channel, and the Blue channel.

10. The system of claim 8, wherein the correction application circuit is to adjust the Red channel, the Green channel, and the Blue channel by at least one of (a) subtracting the respective correction values from corresponding values of the Red channel, the Green channel, and the Blue channel or (b) scaling the respective values of the Red channel, the Green channel, and the Blue channel by the corresponding correction values.

11. The system of claim 8, wherein the correction model is at least one of a radial model, a piecewise linear model, or a higher-order polynomial model.

12. The system of claim 8, wherein the estimated illumination characteristics include at least one of a percentage of IR radiation in the Red channel, the Green channel, and the Blue channel, respectively, or a white point of the illumination.

13. The system of claim 8, wherein the parameter selection circuit is to select the set of correction model parameters based on at least one of a geometry of the RGB-IR sensor, a material of the RGB-IR sensor, or a position of a lens relative to the RGB-IR sensor.

14. The system of claim 8, wherein the parameter selection circuit is to select the set of correction model parameters based on at least one of (a) a set of calibration parameters associated with a known illumination characteristic or (b) interpolation of two or more sets of calibration parameters.

15. A processor-implemented method comprising:
estimating, by a processor-based system, illumination characteristics of an image of a subject based on a signal output by a hybrid Red-Green-Blue Infrared (RGB-IR) sensor, the signal corresponding to a plurality of pixels, respective ones of the pixels associated with a Red channel, a Green Channel, a blue Channel, or an infrared (IR) channel;
selecting, by the processor-based system, a set of correction model parameters from a plurality of stored sets of correction model parameters based on the estimated illumination characteristics;
executing, by the processor-based system and based on the selected set of correction model parameters, a correction model to generate correction weights for the Red channel, the Green channel, and the Blue channel, respectively, the correction model to define the respective correction weights based on a size of the image and a location of an optical center of the image;
generating, by the processor-based system, correction values for the Red channel, the Green channel, and the Blue channel, respectively, based on an IR channel value and corresponding ones of the correction weights, the correction weights different than the IR channel value; and
adjusting, by the processor-based system, the Red channel, the Green channel, and the Blue channel based on the corresponding ones of the correction values to reduce IR crosstalk between the IR channel and the Red channel, the Green channel, and the Blue channel.

16. The method of claim 15, wherein the generating of the correction values is based on a product of the corresponding correction weight and the IR channel value.

17. The method of claim 15, wherein the adjusting of the Red channel, the Green channel, and the Blue channel includes at least one of (a) subtracting the respective correction values from the corresponding values of the Red channel, the Green channel, and the Blue channel or (b) scaling the respective values of the Red channel, the Green channel, and the Blue channel by the corresponding correction values.

18. The method of claim 15, wherein the correction model is at least one of a radial model, a piecewise linear model, or a higher-order polynomial model.

19. The method of claim 15, wherein the estimated illumination characteristics include at least one of a percentage of IR radiation in the Red channel, the Green channel, and the Blue channel, respectively, or a white point of the illumination.

20. The method of claim 15, further including selecting the set of correction model parameters based on at least one of a geometry of the RGB-IR sensor, a material of the RGB-IR sensor, or a position of a lens relative to the RGB-IR sensor.

21. The method of claim 15, wherein the selecting of the set of correction model parameters further includes at least one of (a) selecting a set of calibration parameters associated with a known illumination characteristic or (b) interpolating two or more sets of calibration parameters.

22. An apparatus comprising:
    at least one memory;
    instructions in the apparatus; and
    processor circuitry to execute the instructions to:
        estimate illumination characteristics of an image of a subject based on a signal output by a hybrid Red-Green-Blue Infrared (RGB-IR) sensor, the signal corresponding to a plurality of pixels, respective ones of the pixels associated with a Red channel, a Green Channel, a Blue Channel, or an infrared (IR) channel;
        select a set of correction model parameters from a plurality of stored sets of correction model parameters based on the estimated illumination characteristics;
        execute, based on the selected set of correction model parameters, a correction model to generate correction weights for the Red channel, the Green channel, and the Blue channel, respectively, the correction model to define the respective correction weights based on a size of the image and a location of an optical center of the image;
        generate correction values for the Red channel, the Green channel, and the Blue channel, respectively, based on an IR channel value and corresponding ones of the correction weights, the correction weights different than the IR channel value; and
        adjust the Red channel, the Green channel, and the Blue channel based on the corresponding ones of the correction values to reduce IR crosstalk between the IR channel and the Red channel, the Green channel, and the Blue channel.

23. The apparatus of claim 22, wherein the processor circuitry is to generate the respective correction values based on a product of the IR channel value and the corresponding correction weight for the Red channel, the Green channel, or the Blue channel.

24. The apparatus of claim 22, wherein the processor circuitry is to adjust the Red channel, the Green channel, and the Blue channel by at least one of (a) subtracting the respective correction values from corresponding values of the Red channel, the Green channel, and the Blue channel or (b) scaling the respective values of the Red channel, the Green channel, and the Blue channel by the corresponding correction values.

25. The apparatus of claim 22, wherein the correction model is at least one of a radial model, a piecewise linear model, or a higher-order polynomial model.

26. The apparatus of claim 22, wherein the estimated illumination characteristics include at least one of a percentage of IR radiation in the Red channel, the Green channel, and the Blue channel, respectively, or a white point of the illumination.

27. The apparatus of claim 22, wherein the processor circuitry is to select the set of correction model parameters based on at least one of a geometry of the RGB-IR sensor, a material of the RGB-IR sensor, or a position of a lens relative to the RGB-IR sensor.

28. The apparatus of claim 22, wherein the processor circuitry is to select the set of correction model parameters by at least one of (a) selecting a set of calibration parameters associated with a known illumination characteristic or (b) interpolating two or more sets of calibration parameters.

* * * * *